United States Patent [19]

Rideout et al.

[11] Patent Number: 5,299,057
[45] Date of Patent: Mar. 29, 1994

[54] MONOLITHICALLY INTEGRATED OPTICAL AMPLIFIER AND PHOTODETECTOR TAP

[75] Inventors: William C. Rideout, Townsend; Robert Olshansky, Wayland; Elliot G. Eichen, Arlington, all of Mass.

[73] Assignee: GTE Laboratories Incorporated, Waltham, Mass.

[21] Appl. No.: 968,639

[22] Filed: Oct. 29, 1992

[51] Int. Cl.$^5$ .......................... H01S 3/19; H01S 3/096
[52] U.S. Cl. .................................... 359/345; 359/174; 359/344; 257/79; 257/431
[58] Field of Search .................... 359/174, 344, 345; 357/17, 30; 385/131

[56] References Cited

U.S. PATENT DOCUMENTS

| | | | |
|---|---|---|---|
| 5,069,561 | 12/1991 | Rideout et al. | 385/14 |
| 5,097,299 | 3/1992 | Donhowe et al. | 357/30 |
| 5,103,455 | 4/1992 | Eichen et al. | 372/50 |
| 5,119,039 | 6/1992 | Olshansky et al. | 359/346 |
| 5,185,756 | 2/1993 | Olshansky et al. | 372/50 |

OTHER PUBLICATIONS

Kobayashi & Kimura, Automatic Frequency Control in Semiconductor Laser and Optical Amplifier, Journal of Lightwave Technology, vol. LT-1, No. 2, Jun. 1983.
100 Mbit/s Laser Diode Terminal with Optical Gain for Fibre-Optic Local Area Networks, Electronics Letters, vol. 20, No. 19, Sep. 13, 1984.
Eicher et al, Proc. SPIE, Int. Soc, Opt. Eng., vol. 1474, pp. 260–267, Apr. 3, 1991; abst. only provided herewith.
Tsang et al, Jun. 30, 1983, 4th Int. Conf. Integ. Opt. & Opt. Fiber Comm.; Japan, pp. 28–29; abst. only provided.
Wadehar et al, Sep. 8, 1988, Proc. SPIE, Int. Soc. Opt. Eng., vol. 994, pp. 133–140; abst. only provided herewith.
Koai et al, ECOC 90, 16th European Conf. Opt. Comm. Sep. 20, 1990, pp. 255–258, vol. 1 (abst. only provided herewith).

Primary Examiner—Nelson Moskowitz
Attorney, Agent, or Firm—Lawrence E. Monks

[57] ABSTRACT

A semiconductor optical amplifier with a high speed photodetector acting as an optical tap is disclosed. The device functions simultaneously as an in-line optical amplifier and as a high-speed photodetector tap. An in-line an optical amplifier is combined with a waveguiding, high speed (low capacitance) reverse-biased photodetector that absorbs only a percentage of the amplified signal, allowing the remainder to pass through without distortion.

9 Claims, 2 Drawing Sheets

MONOLITHICALLY INTEGRATED OPTICAL AMPLIFIER AND PHOTODETECTOR TAP

FIELD OF THE INVENTION

The invention relates to a combination optical amplifier and photodetector tap and more particularly to a monolithic optical amplifier and photodetector tap for detection and transmission of an optical signal.

BACKGROUND OF THE INVENTION

Optical amplifiers are key components in the design of many planned fiber optic communication systems. There are many advantages to an optical amplifier that also produces an electrical signal proportional to the optical signal passing through, in effect acting both as an amplifier and as an optical tap. The ability to simultaneously amplify and detect an optical signal has lead to a number of applications for semiconductor optical amplifiers including lossless signal tapping and photonic packet switching. Conventional approaches monitor the terminal voltage applied to a semiconductor optical amplifier as described by Koayashi and Kimura in the *Journal of Lightwave Technology*, vol 1, pages 394-401 (1983) and by Alping, Bentland and Eng in *Electronics Letters*, vol 20, pages 794-795 (1984). A hybrid combination of an optical amplifier, a fiber splitter to divide the output signal, and a high speed photodetector to detect the signal in one branch of the splitter have also been utilized.

The first approach suffers from a bandwidth limitation due to the carrier lifetime of the forward-biased amplifier. While two-section (or split contact) semiconductor amplifiers offer greater photodetector responsitivity and additional flexibility for signal processing and/or signal modulation techniques than single contact semiconductor optical amplifiers, the electrical frequency response of all semiconductor optical amplifiers operating as detectors is limited by this carrier lifetime which varies from a few GHz in quantum well amplifiers to less than 1 GHz in bulk devices. This is a significant limitation in view of the increasingly high data rates required of lightwave systems. Furthermore, the signal intensity from the terminal voltage of the amplifier is reduced in comparison to that from a typical photodetector because of the poor impedance matching to a normal 50 ohm microwave environment.

Splitting the signal also has disadvantages. The use of hybrid components results in a device that is bulky and complex. If monolithic integration were attempted the loss due to the splitting of the signal in a monolithic waveguide is typically excessive.

It is thus desirable to fabricate a monolithically integrated optical amplifier having a photodetector tap which provides for only a small loss in signal power due to the tap.

OBJECTS OF THE INVENTION

Accordingly, it is a primary of this invention to obviate the above noted and other disadvantages of the prior art.

It is a further object of the invention to provide a monolithically integrated optical amplifier and photodetector tap with only partial absorption of the optical signal at the tap.

SUMMARY OF THE INVENTION

The above and other objects and advantages are achieved in one aspect of this invention by monolithically integrating a semiconductor optical amplifier in line with a high-speed reverse-biased waveguiding photodetector that absorbs only a percentage of the light passing through. By reverse biasing the photodetector, the bandwidth is greatly increased in comparison to that of a forward-biased amplifier and furthermore, matching to a 50 Ohm microwave environment is much easier. By placing the photodetector in line after the amplifier, the available signal is greatly increased and the signal loss associated with splitting is avoided. The photodetector absorbs only a portion of the light therefor acting as a tap. Moreover, the photodetector is a waveguide, and consequently the light passing through is undistorted and is efficiently coupled into a signal mode fiber for further propagation of the signal.

Moreover, the method for growth and fabrication of the device by which a p-InP tilted ridge is selectively grown through a dielectric mask on planar n-type epitaxial layers, has considerably fewer processing steps than conventional etch and regrown techniques for photonic integration, and leads to spatially confined pn junctions and very low device capacitances. Based upon measurements of spontaneous-spontaneous beat noise, the device can perform lossless signal tapping of 10 Gb/s baseband modulated signals with an expected receiver sensitivity of 31 24 dBm.

Performance of the amplifier is improved by applying an anti-reflection coating. However, a very good quality coating which is consequently difficult to apply is required to give true traveling wave performance due to the residual reflectivity between the amplifier and the photodetector. Using a tilted-stripe ridge waveguide with a single spatial mode or a regrown end cap region, the device only requires an easily achieved 10% anti-reflection coating to yield true traveling wave performance from the amplifier section.

BRIEF DESCRIPTION OF THE DRAWINGS

For a better understanding of the present invention, together with other objects, advantages and capabilities thereof, reference is made to the following Description and appended Claims, together with the Drawings, in which:

DETAILED DESCRIPTION OF THE PREFERRED EMBODIMENTS

Figure 1:
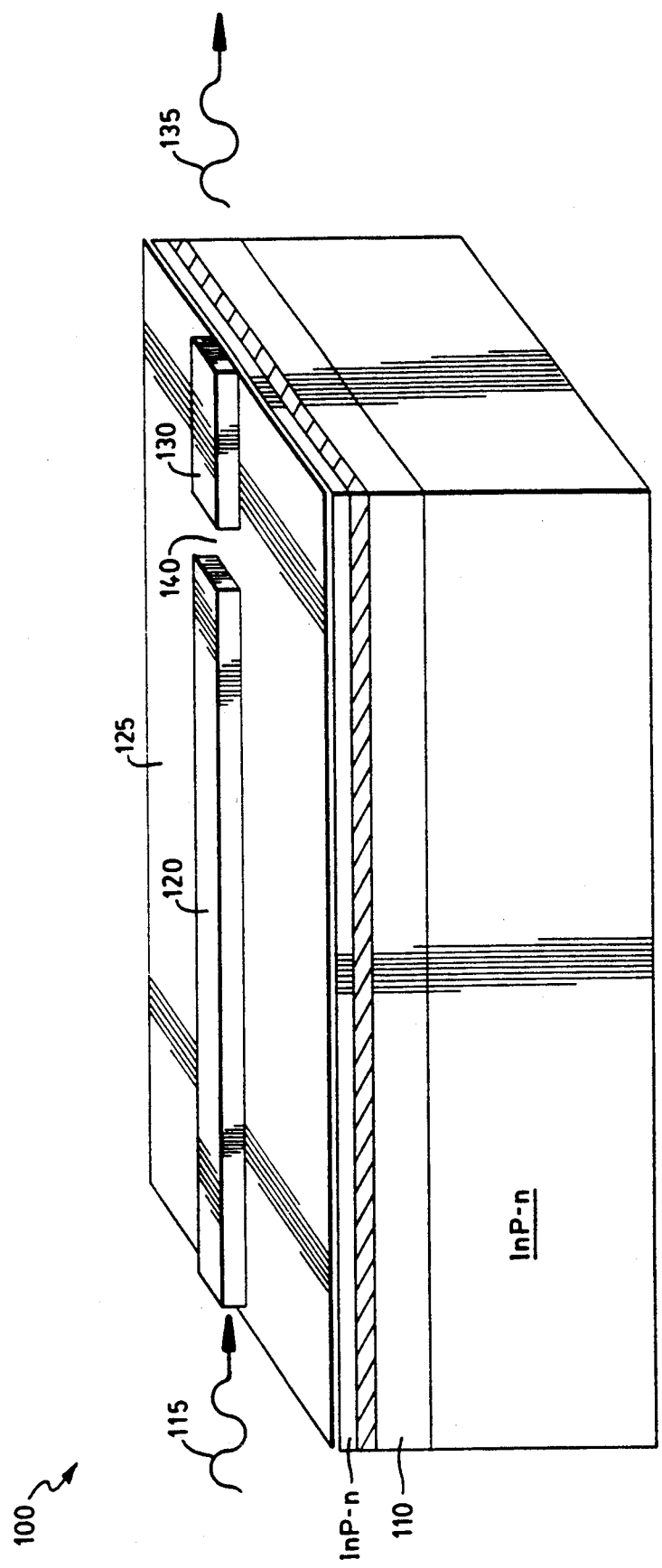
FIG. 1 is a perspective view of a monolithically integrated optical amplifier and photodetector tap having a single amplifier section in accordance with the current invention.

A monolithically integrated optical amplifier and photodetector tap 100 as shown in FIG. 1 consists of a single waveguide 110, where the first section is forward biased to produce a semiconductor optical amplifier 120, and the second section is a reversed biased waveguiding photodetector 130 which absorbs only a percentage of the outgoing light 135. The remainder of the light is transmitted from the device. This device serves as a semiconductor optical amplifier due to gain in the amplifier section 120 which is approximately 25 dB.

The gain exceeds the loss due to absorption in the photodetector section 130 which is typically between 1 and 3 dB. The device operates as a high performance optical tap converting part of the amplified optical signal into an electrical signal and having a wide bandwidth exceeding 40 GHz.

One embodiment of an integrated optical amplifier and photodetector tap 100 is shown in FIG. 1. In this embodiment the waveguide 110 is formed by the ridge of InP on top of a planar structure 125. Light 115 enters the longer section 120 of the ridge which is forward biased to form an amplifying section. The light is amplified as it passes through the amplifier region, and then passes from The amplifier to the photodetector region 130. The photodetector region also functions as a waveguide so that the light does not diffract outward. The photodetector is formed as a ridge structure 130, so that any light the photodetector does not absorb exits the device in a single spatial mode, where it can then be coupled into a fiber. Signal absorption at the photodetector is given by $1 - \exp(-\Gamma \alpha L)$ where $\Gamma$ is the optical confinement factor (the amount of the mode intensity inside the active region), $\alpha$ the absorption coefficient of the active region, and L the detector length. Sample values for the device shown in FIG. 1 correspond to $\Gamma = 0.15$, $\alpha = 3 \times 10^3$ cm$^{-1}$, and L=15 microns so that 50% of the amplified light would be absorbed and 50% transmitted. Shorter or longer lengths could be chosen depending on the required amount of signal to be tapped out. The bandwidth of the photodetector is determined by its capacitance, which is approximately 0.07 pF for the dimensions described above. This yields a bandwidth of greater than 40 GHz.

The device is selectively grown as two section ridge waveguides 120 and 130 having an electrical isolation region 140 formed between ridge sections 120, 130. The two section ridge waveguides 120, 130 are fabricated by selectively regrowing a 2.5 μm wide p-InP ridge at 7° off axis to the 110 crystal plane, through a window opened in a dielectric mask, on an all n-type epitaxially grown base structure. The base structure 125 consists of an n+InGaAsP ($\lambda = 1.06$ μm) guide layer 0.4 μm thick, an undoped InGaAsP ($\lambda = 1.3$ μm) active layer 0.12 μm thick and an InP top cladding layer 0.1 μm thick. The p dopant (Zn) diffuses from the ridge into the InGaAsP active region. This forms and confines the pn junction to an area directly below the ridge, thus allowing for low capacitance high-speed operation. An amplifier 120 of 1000 μm is separated from a 15 μm photodetector section 130 by a 2 μm non-guiding region 140. By reverse biasing the short rear section, in-line taps with 3 dB electrical bandwidths of 7 GHz, responsivity of 16 Amps/Watt, and fiber-to-fiber gains of 5 dB are obtained. Chip gain is measured by using the entire device as an amplifier (i.e., forward biasing both amplifier and photodetector regions), and the effective facet reflectivity—estimated from the gain ripple—is found to be −36 dB without anti-reflection (AR) coatings. An additional 11 dB in reduction of the facet reflectivity below the −25 dB due to tilting the facet is due to absorption of the signal in the photodetector section. Consequently, the device operates as a lossless tap because the bulk of the reduction in facet reflectivity is due to the tilted facet, and thus is independent of signal absorption or AR coatings. This allows the use of a short photodetector section in which only a moderate portion of the signal is absorbed.

Figure 2:
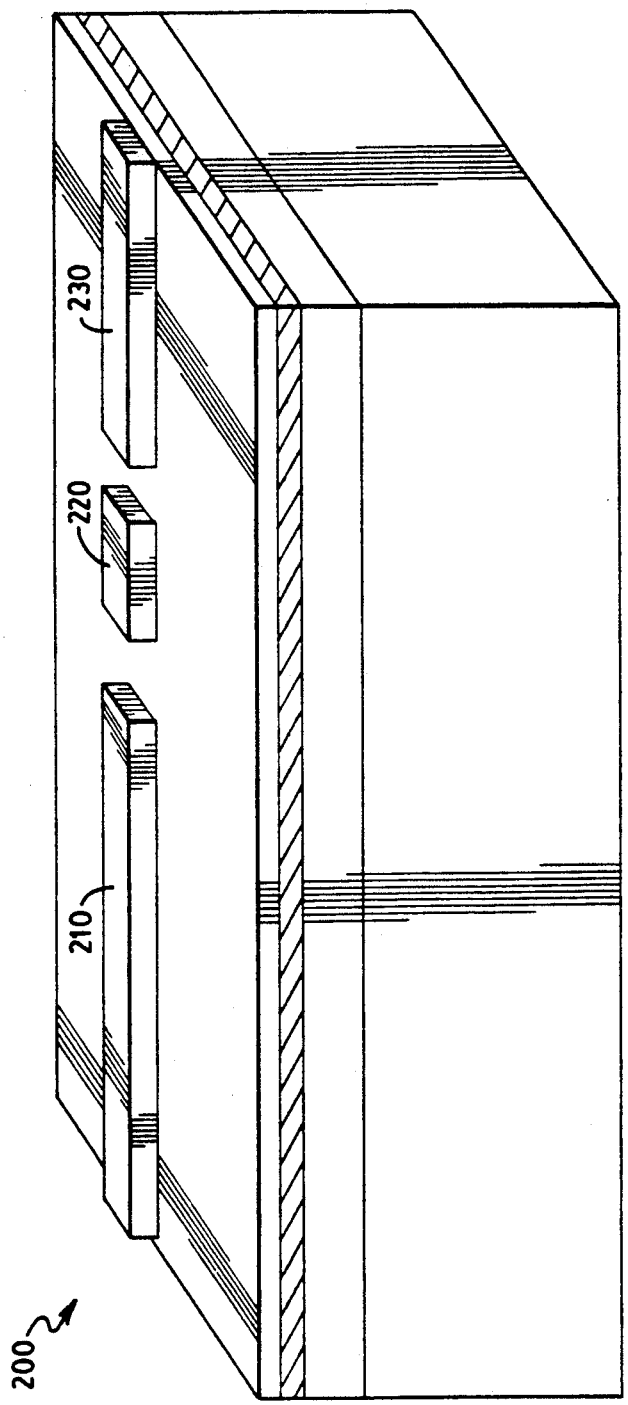
FIG. 2 is a perspective view of a monolithically integrated optical amplifier and photodetector tap having a a second amplifier section after the photodetector tap in accordance with the current invention.

The electrical frequency response of the photodetector section was measured by reverse biasing the photodetectors with −1.5 V and illuminating them with light from a modulated high frequency semiconductor laser (FIG. 2). The 3 dB bandwidth of 7 GHz is limited by high contact series resistance which should be reduced by zinc diffusion before metallization. The fidelity of the recovered signal is shown by the response of the device to a 3 Gb/s data stream as shown in FIG. 3.

The receiver noise of the photodetector is dominated by beating of the amplified spontaneous emission (ASE) with itself, because there is no optical filtering of the ASE. With a fiber to amplifier coupling efficiency of $\eta_f$, amplifier to detector coupling efficiency of $\eta_d$, amplifier chip gain of G, photodetector responsivity of r, system bandwidth of B, received optical power of P, and spontaneous-spontaneous beat noise component of $i^2_{sp\text{-}sp}$ [amps$^2$/Hz], the signal-to-noise for a baseband ASK system is given by $\{r\eta_f\eta_d G\, P\}^2/(i^2_{sp\text{-}sp} B)$.

For a 1 mm long amplifier section biased to 250 mA and a 15 μm long photodetector section biased to −1.5 V, the fiber-to-fiber gain was 5 dB, the effective device responsivity R ($r\eta_f\eta_d G$) was 16 Amps/Watt, and the spontaneous-spontaneous beat noise floor was −147 dBm/Hz.

Acting as an in-line tap for a 10 Gb/s baseband system, the receiver sensitivity for a $10^{-9}$ bit-error-ratio is calculated to be $\simeq -19$ dBm.

Residual facet reflectivity causes reduced amplifier gain, gain ripple due to Fabry-Perot resonance, and increased noise. Performance is improved by applying an anti-reflection coating. However, a very good quality coating which is consequently difficult to apply is required to give true traveling wave performance due to the residual reflectivity between the amplifier and the photodetector. Using a tilted-stripe ridge waveguide with a single spatial mode as described U.S. Pat. No. 5,069,561 which is incorporated by reference herein, or by using a regrown end cap region as described in U.S. Pat. No. 4,872,180 which is incorporated by reference herein the device only requires an easily achieved 10% anti-reflection coating to yield true traveling wave performance from the amplifier section.

In an another embodiment of this device, a second amplifying section 230 is added after the photodetector tap 220 section as shown in FIG. 2. This second amplification section 230 overcomes the small loss associated with the photodetector tap, and increases the effective amplification of the device.

While there has been shown and described what is at present considered the preferred embodiment of the invention it will be obvious to those skilled in the art that various changes and modifications may be made therein without departing from the invention as defined by the appended claims.

What is claimed is:

1. An optoelectronic device for amplifying and detecting an optical signal comprising:
   a body of semiconductor material having a waveguide structure with a first section including first and second opposed facet surfaces and forward biased for amplifying said optical signal;
   said waveguide structure including a second section, electrically isolated from said first section, and reversed biased for detecting said optical signal:
   wherein said optical signal is partially absorbed by said second section and partially passed through said second section.

2. The optoelectronic device of claim 1 wherein:
said first section includes a first regrown end cap region adjacent to said first major facet surface such that the boundary between the first end cap region and said first major facet surface is an inner end cap facet interface, and wherein said first cap region has an outer end cap facet opposed to said associated inner end cap facet interface;

said first section further includes a second regrown end cap region adjacent to said second major facet surface such that the boundary between the second end cap region and said second major facet surface is an inner end cap facet interface, and wherein said second cap region has an outer end cap facet opposed to said associated inner end cap facet interface;

said first and second regrown end cap regions have an index of refraction which is approximately equal to an effective refractive index of said waveguiding structure providing a reduced facet reflectivity at both the inner cap facet interface of said first grown end cap region and the inner end cap interface of said second regrown end cap region.

3. The optoelectronic device of claim 1 wherein:
the first section of the waveguide structure includes a ridge.

4. The optoelectronic device of claim 1 wherein:
the second section of the waveguide structure includes a ridge.

5. The optoelectronic device of claim 1 wherein:
said ridge of the first section is fabricated from InP.

6. The optoelectronic device of claim 1 wherein:
said ridge of the second section is fabricated from InP.

7. The optoelectronic device of claim 1 wherein:
each of said inner end cap facet interfaces has an anti-reflection coating.

8. The optoelectronic device of claim 1 wherein:
said second section of said waveguiding structure forms a photodetector.

9. The optoelectronic device of claim 1 wherein:
said first section of said waveguiding structure forms a semiconductor laser amplifier.

* * * * *